(12) United States Patent
Zhai

(10) Patent No.: US 10,304,966 B2
(45) Date of Patent: May 28, 2019

(54) METAL OXIDE TFT DEVICE AND MANUFACTURING METHOD THEREOF

(71) Applicant: Shenzhen China Star Optoelectronics Technology Co., Ltd., Shenzhen (CN)

(72) Inventor: Yuhao Zhai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 5 days.

(21) Appl. No.: 15/545,325

(22) PCT Filed: Jun. 14, 2017

(86) PCT No.: PCT/CN2017/088193
§ 371 (c)(1),
(2) Date: Jul. 21, 2017

(87) PCT Pub. No.: WO2018/201560
PCT Pub. Date: Nov. 8, 2018

(65) Prior Publication Data
US 2018/0323311 A1    Nov. 8, 2018

(30) Foreign Application Priority Data

May 2, 2017   (CN) .......................... 2017 1 0302060

(51) Int. Cl.
*H01L 27/12*  (2006.01)
*H01L 29/786*  (2006.01)
(Continued)

(52) U.S. Cl.
CPC ........ *H01L 29/78696* (2013.01); *H01L 29/24* (2013.01); *H01L 29/4908* (2013.01);
(Continued)

(58) Field of Classification Search
CPC ..................... H01L 27/1225; H01L 29/78696
See application file for complete search history.

(56) References Cited

U.S. PATENT DOCUMENTS

2015/0221507 A1    8/2015  Won et al.
2017/0288060 A1*  10/2017  Park .................... H01L 27/1225
2018/0254185 A1*   9/2018  Benwadih ......... H01L 21/02628

FOREIGN PATENT DOCUMENTS

CN        103715269 A    4/2014
CN        105280717 A    1/2016
KR     20160109647 A    9/2016

* cited by examiner

*Primary Examiner* — Thomas L Dickey
(74) *Attorney, Agent, or Firm* — Leong C. Lei

(57) ABSTRACT

The present invention provides a metal oxide TFT device and a manufacturing method thereof. An active layer (7) of the metal oxide TFT device applies a structure like sandwich, which comprises a lower indium gallium zinc oxide thin film (71), an upper indium gallium oxide thin film (73) disposed opposite to the lower indium gallium zinc oxide thin film (71), and an intermediate conducting layer (75) interposed between the lower indium gallium oxide thin film (71) and the upper indium gallium oxide thin film (73). The intermediate conducting layer (75) is selected from the group consisting of high indium-containing metal oxide and high zinc-containing metal oxide, which is capable of further improving electron mobility, reducing interface defects between an active layer (7) and a gate insulating layer (5), and improving the electrical properties of a TFT device.

8 Claims, 4 Drawing Sheets

(51) Int. Cl.
*H01L 29/24* (2006.01)
*H01L 29/66* (2006.01)
*H01L 29/49* (2006.01)
(52) U.S. Cl.
CPC .... *H01L 29/66969* (2013.01); *H01L 29/7869* (2013.01); *H01L 27/1225* (2013.01)

METAL OXIDE TFT DEVICE AND MANUFACTURING METHOD THEREOF

BACKGROUND OF THE INVENTION

Field of Invention

The present invention relates to the field of liquid crystal display, and more particularly to a metal oxide TFT device and a manufacturing method thereof.

Description of Prior Art

With a thin body, power saving, no radiation and many other advantages, the flat panel displays have been widely used. The conventional flat panel displays include Liquid Crystal Displays (LCD) and Organic Light Emitting Displays (OLED).

On the market, most of the liquid crystal displays are backlight type LCDs, which individually includes a housing, a liquid crystal panel provided in the housing, and a backlight module provided in the housing. The liquid crystal panel is composed of a color filter substrate (CF), a thin film transistor array substrate (TFT Array Substrate), and a liquid crystal layer disposed between the two substrates, the working principle is: applying a driving voltage to the two substrates to control the rotation of the liquid crystal molecules of the liquid crystal layer, and the light of the backlight module is refracted to generate an image.

The OLED also requires a TFT substrate, to take a TFT device as a switching element and a driving element, and a pixel structure in an array arrangement is formed on the TFT substrate.

In addition, the TFT devices are also present in a large area integrated circuit.

Presently, a technology of using the metal oxides, such as indium gallium zinc oxide (IGZO), as the active layer of TFT devices, is a popular technology. The metal oxide has high electron mobility, excellent film uniformity and surface flatness, and has high compatibility with amorphous silicon process. Therefore, the metal oxide gradually becomes the preferred material of the active layer of the TFT device in the LCD and OLED.

Presently, the electron mobility of the active layer of the metal oxide TFT device represented by IGZO still needs to be further improved, and in general, the contact interface between the IGZO and the gate insulating layer captures electrons for the defects, to affect the switching state of the TFT device.

SUMMARY OF THE INVENTION

An object of the present invention is to provide a metal oxide TFT device, which is capable of further improving electron mobility, reducing interface defects between an active layer and a gate insulating layer, and improving the electrical properties of a TFT device.

Another object of the present invention is to provide a manufacturing method of a metal oxide TFT device, a metal oxide TFT device manufactured by the method can further improve the electron mobility and reduce the interface defects between the active layer and the gate insulating layer, and improve the electrical properties of TFT devices.

In order to achieve the objective, the present invention provides a metal oxide TFT device, which comprises a substrate, a gate electrode provided on the substrate, a gate insulating layer covering the gate electrode and the substrate, an active layer disposed on the gate insulating layer over the gate electrode, and a source electrode and a drain electrode disposed on the gate insulating layer and respectively contacted with two sides of the active layer.

The active layer comprises a lower indium gallium zinc oxide thin film, an upper indium gallium oxide thin film disposed opposite to the lower indium gallium zinc oxide thin film, and an intermediate conducting layer interposed between the lower indium gallium oxide thin film and the upper indium gallium oxide thin film. The intermediate conducting layer is selected from the group consisting of high indium-containing metal oxide and high zinc-containing metal oxide.

The intermediate conductive layer is selected from the group consisting of indium tin oxide, indium zinc oxide, and aluminum doped zinc oxide.

A thickness of the intermediate conducting layer is 2 nm to 10 nm, and a thickness of the active layer is 30 nm to 100 nm.

A block resistance of the intermediate conductive layer is less than or equal to $1\times10^4 \Omega/\square$.

The substrate is a glass substrate.

The gate electrode, the source electrode and the drain electrode are all selected from the group consisting of molybdenum and aluminum, and a stack of molybdenum and aluminum.

The gate insulating layer is selected from the group consisting of silicon oxide or alumina.

The present invention further provides a manufacturing method of a metal oxide TFT device, which comprises:

A substrate is provided, a first metal layer is deposed, and the first metal layer is patterned to form a gate electrode.

A gate insulating layer is deposed on the gate electrode and the substrate.

An indium gallium oxide is firstly deposed on the gate insulating layer to form a lower indium gallium zinc oxide thin film, a high indium-containing metal oxide or a high zinc-containing metal oxide is secondly deposed to form an intermediate conducting layer, then, the indium gallium oxide is deposed to form an upper indium gallium zinc oxide thin film.

A stack-layer of the lower indium gallium zinc oxide thin film, the intermediate conducting layer, and the upper indium gallium zinc oxide thin film is patterned, to form an active layer over the gate electrode.

A second metal layer is deposed on the gate insulating layer and the active layer and the second metal layer is patterned to form a source electrode and a drain electrode respectively contacted with two sides of the active layer.

The intermediate conducting layer is formed by deposing one from the group consisting of indium tin oxide, indium zinc oxide, and aluminum doped zinc oxide.

A thickness of the intermediate conducting layer is 2 nm to 10 nm, and a thickness of the active layer is 30 nm to 100 nm.

A block resistance of the intermediate conductive layer is less than or equal to $1\times10^4 \Omega/\square$.

The substrate is a glass substrate.

The first metal layer and the second metal layer are both selected from the group consisting of molybdenum and aluminum, and a stack of molybdenum and aluminum.

The gate insulating layer is selected from the group consisting of silicon oxide or alumina.

The present invention further provides a metal oxide TFT device, which comprises a substrate, a gate electrode provided on the substrate, a gate insulating layer covering the gate electrode and the substrate, an active layer disposed on the gate insulating layer over the gate electrode, and a source electrode and a drain electrode disposed on the gate insulating layer and respectively contacted with two sides of the active layer.

The active layer comprises a lower indium gallium zinc oxide thin film, an upper indium gallium oxide thin film disposed opposite to the lower indium gallium zinc oxide thin film, and an intermediate conducting layer interposed between the lower indium gallium oxide thin film and the upper indium gallium oxide thin film. The intermediate conducting layer is selected from the group consisting of high indium-containing metal oxide and high zinc-containing metal oxide.

Wherein, the intermediate conductive layer is selected from the group consisting of indium tin oxide, indium zinc oxide, and aluminum doped zinc oxide.

Wherein, a thickness of the intermediate conducting layer is 2 nm to 10 nm, and a thickness of the active layer is 30 nm to 100 nm.

The beneficial effects of the present invention is: the present invention provides a metal oxide TFT device, which applies a structure like sandwich on the active layer, which comprises a lower indium gallium zinc oxide thin film, an upper indium gallium oxide thin film, and an intermediate conducting layer interposed between the lower indium gallium oxide thin film and the upper indium gallium oxide thin film. The intermediate conducting layer is selected from the group consisting of high indium-containing metal oxide and high zinc-containing metal oxide. Since the vacant s orbit of indium ions or zinc ions can form an electron transporting path, and the concentration of carriers can be increased by taking an intermediate conductive layer containing a high indium-containing metal oxide or a high zinc-containing metal oxide as a material, thereby further improving the electron mobility of the TFT device. Meanwhile, because the carriers are mainly concentrated in the intermediate conductive layer, which corresponds to the main channel and the lower indium gallium zinc oxide thin film serves to improve the contact interface between the active layer with the gate insulating layer, then reducing interface defects, to prevent the interface defects from affecting the electrical properties of the TFT device and to improve the electrical properties of the TFT device. In a metal oxide TFT device manufactured by a manufacturing of a metal oxide TFT device of the present invention, which applies a structure like sandwich on the active layer, which comprises a lower indium gallium zinc oxide thin film, an upper indium gallium oxide thin film, and an intermediate conducting layer interposed between the lower indium gallium oxide thin film and the upper indium gallium oxide thin film, further improving the electron mobility of the TFT device, reducing interface defects between the active layer and the gate insulating layer, and improving the electrical properties of the TFT device.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

The technical proposals and the effects of the present invention will be described in further detail with reference to the below preferred embodiments of the present invention and their accompanying drawings.

Figure 1:
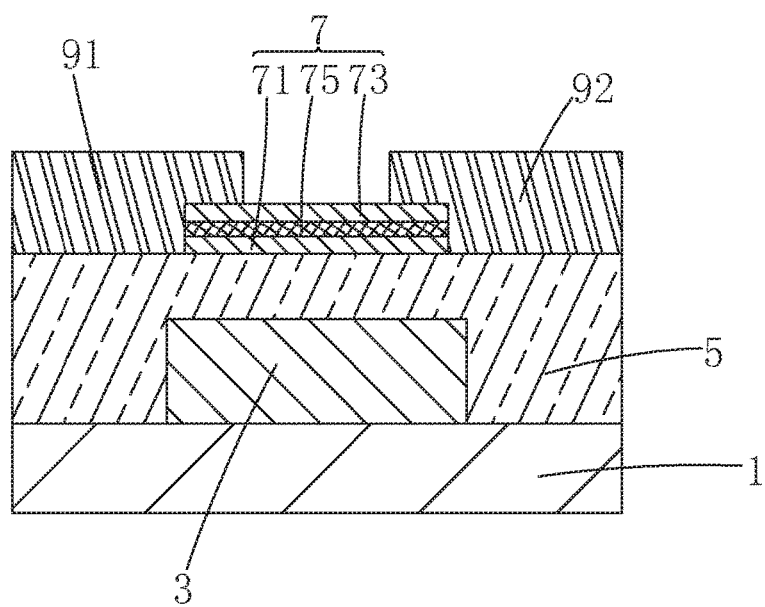
FIG. 1 is a schematic cross-sectional view of a metal oxide TFT device according to the present invention.

Please refer to FIG. 1, the present invention provides a metal oxide TFT device, which comprises a substrate 1, a gate electrode 3 provided on the substrate 1, a gate insulating layer 5 covering the gate electrode 3 and the substrate 1, an active layer 7 disposed on the gate insulating layer 5 over the gate electrode 3, and a source electrode 91 and a drain electrode 92 disposed on the gate insulating layer 5 and respectively contacted with two sides of the active layer 7.

The active layer 7 applies a structure like sandwich, which comprises a lower indium gallium zinc oxide thin film 71, an upper indium gallium oxide thin film 73 disposed opposite to the lower indium gallium zinc oxide thin film 71, and an intermediate conducting layer 75 interposed between the lower indium gallium oxide thin film 71 and the upper indium gallium oxide thin film 73. The intermediate conducting layer 75 is selected from the group consisting of high indium-containing metal oxide and high zinc-containing metal oxide.

Specifically, the intermediate conductive layer 75 is selected from the group consisting of indium tin oxide (ITO), indium zinc oxide (IZO), and aluminum doped zinc oxide (Al-doped ZnO). Since the vacant s orbit of the positive trivalent indium ion ($In^{3+}$) or the positive bivalent zinc ion ($Zn^{2+}$) is capable of forming an electron transporting path, the intermediate conductive layer 75 containing a high indium-containing metal oxide or a high zinc-containing metal oxide has a large amount of In or $Zn^{2+}$ can greatly increase the electron mobility of the TFT device and increase the concentration of the carriers. Since the block resistance of the intermediate conductive layer 75 is lower than that of the lower indium gallium oxide thin film 71 and the upper indium gallium zinc oxide thin film 73, the carriers are mainly concentrated in the intermediate conductive layer 75, and the intermediate conductive layer 75 is equivalent as a main channel, the lower indium gallium zinc oxide film 71 functions to improve the contact interface between the active layer 7 and the gate insulating layer 5, thereby reducing the interface defects, thereby preventing the interface defects from affecting the electrical properties of the TFT device, to improve the electrical properties of the TFT device.

Furthermore, a thickness of the active layer 7 is 30 nm to 100 nm. The thickness of the intermediate conducting layer 75 needs to be moderate, too thin will make the effect be non-obvious about improving the electron mobility and increasing the carrier's concentration, and too thin might cause a conduction between the source electrode 91 and the drain electrode 92, which is impossible to form a normal TFT device. Hence, preferably, the thickness of the intermediate conducting layer 75 is 2 nm to 10 nm, and a block resistance of the intermediate conductive layer 73 is less than or equal to $1\times10^4 \Omega/\square$ by controlling the process conditions such as the flow rate ratio of argon gas (Ar) and oxygen gas (O2), film formation pressure, and etc., when the intermediate conductive layer 75 is forming.

Specifically, the substrate 1 is a glass substrate. The gate electrode 3, the source electrode 91 and the drain electrode 92 are all selected from the group consisting of molybdenum (Mo) and aluminum (Al), and a stack of molybdenum and aluminum. The gate insulating layer 5 is selected from the group consisting of silicon oxide ($SiO_2$) or alumina ($Al_2O_3$).

Figure 2:
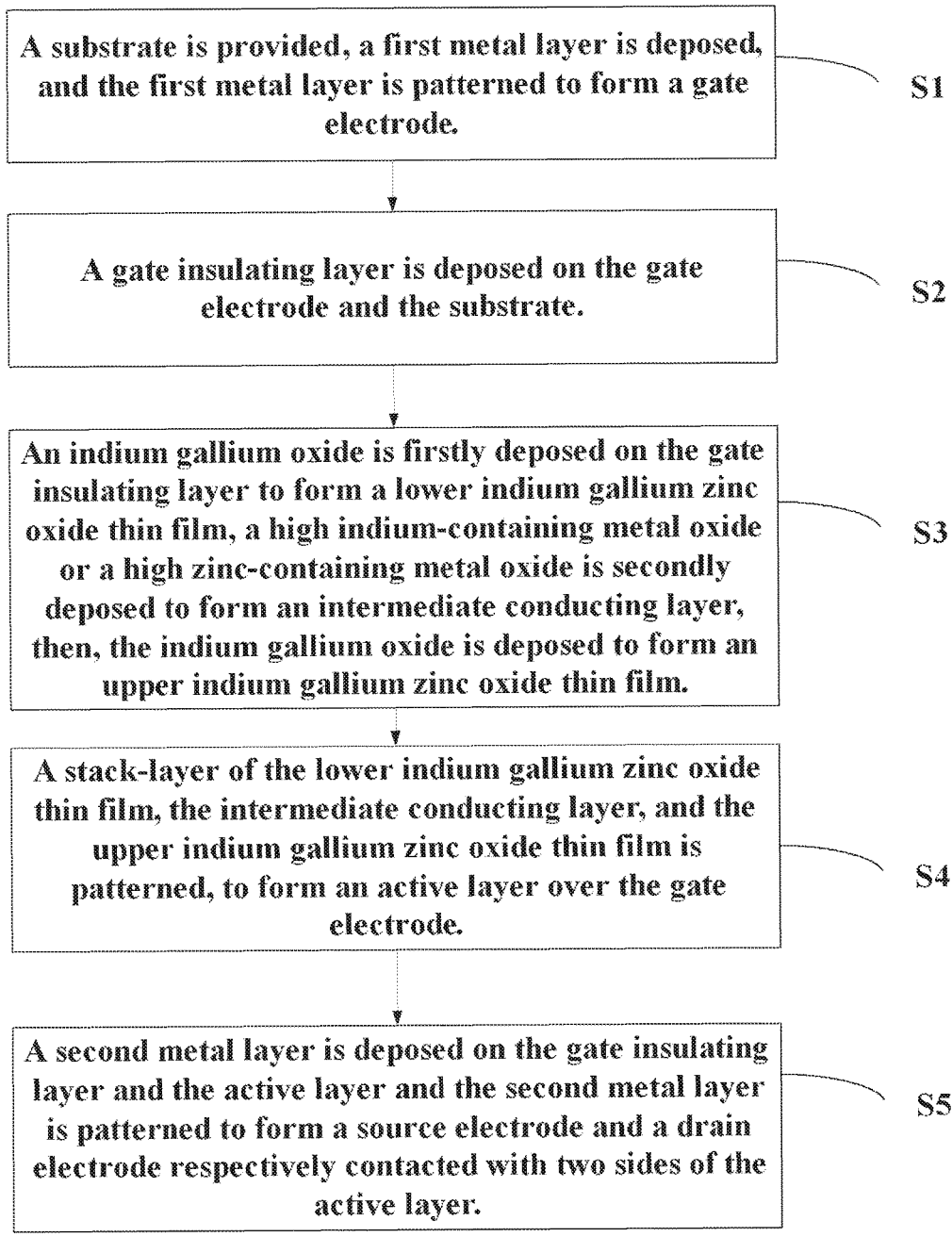
FIG. 2 is a flow diagram of a manufacturing method of a metal oxide TFT device according to the present invention.
Figure 3:
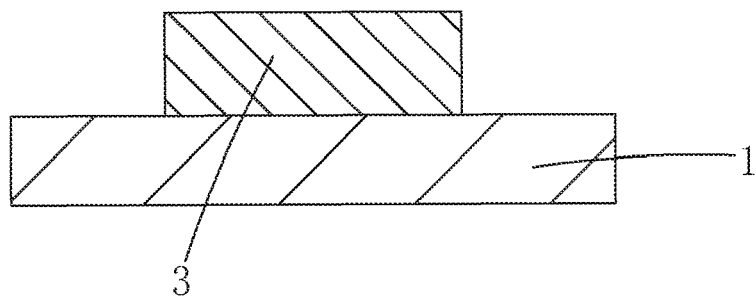
FIG. 3 is a schematic view of the step 1 of the manufacturing method of a metal oxide TFT device according to the present invention.

Please refer to FIG. 2, the present invention further provides a manufacturing method of a metal oxide TFT device, which comprises:

Step S1, as shown in FIG. 3, a substrate 1 is provided, a first metal layer is deposed by a physical vapor deposition (PVD), and the first metal layer is patterned by a photo process and an etching process to form a gate electrode 3.

Specifically, the substrate 1 is preferably a glass substrate. The first metal layer is selected from the group consisting of molybdenum and aluminum, and a stack of molybdenum and aluminum.

Figure 4:
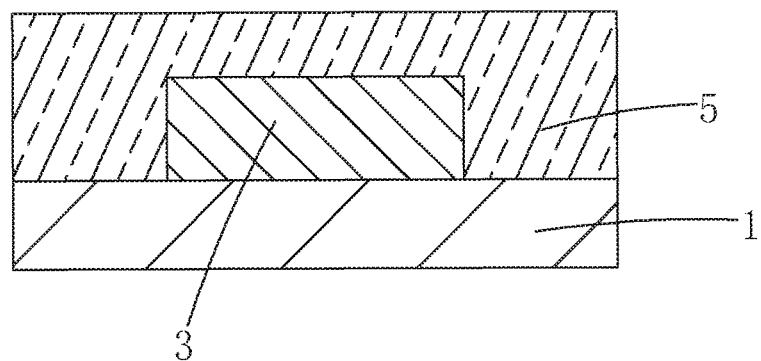
FIG. 4 is a schematic view of the step 2 of the manufacturing method of a metal oxide TFT device according to the present invention.

Step S2, as shown in FIG. 4, a gate insulating layer 5 is deposed on the gate electrode 3 and the substrate 1 by plasma enhanced chemical vapor deposition (PECVD).

Specifically, the gate insulating layer 5 is selected from the group consisting of silicon oxide, or alumina.

Figure 5:
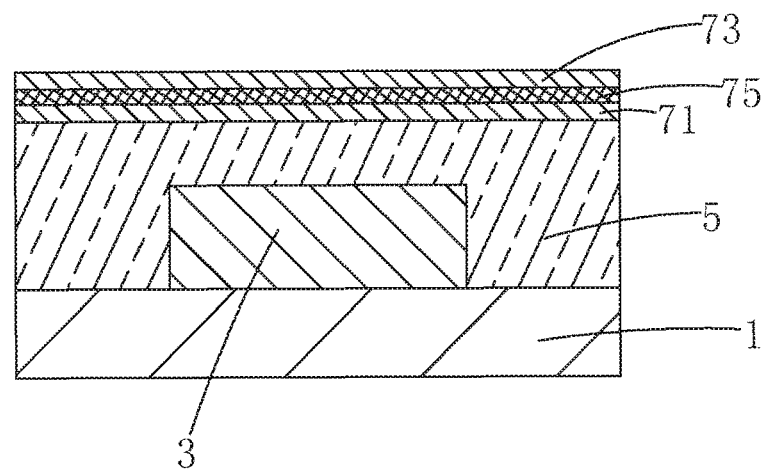
FIG. 5 is a schematic view of the step 3 of the manufacturing method of a metal oxide TFT device according to the present invention.

Step S3, as shown in FIG. 5, an indium gallium oxide is firstly deposed on the gate insulating layer 5 to form a lower indium gallium zinc oxide thin film 71, a high indium-containing metal oxide or a high zinc-containing metal oxide is secondly deposed to form an intermediate conducting layer 75, then, the indium gallium oxide is deposed to form an upper indium gallium zinc oxide thin film 73.

Specifically, in the step S3, the intermediate conducting layer 75 is formed by deposing one from the group consisting of indium tin oxide, indium zinc oxide, and aluminum doped zinc oxide.

A thickness of the active layer 7 is 30 nm to 100 nm. A thickness of the intermediate conducting layer 75 is 2 nm to 10 nm.

In the step S3, a block resistance of the intermediate conductive layer 73 is less than or equal to $1\times10^4 \Omega/\square$ by controlling the process conditions such as the flow rate ratio of argon gas (Ar) and oxygen gas (O2), film formation pressure, and etc., when the intermediate conductive layer 75 is forming.

Figure 6:
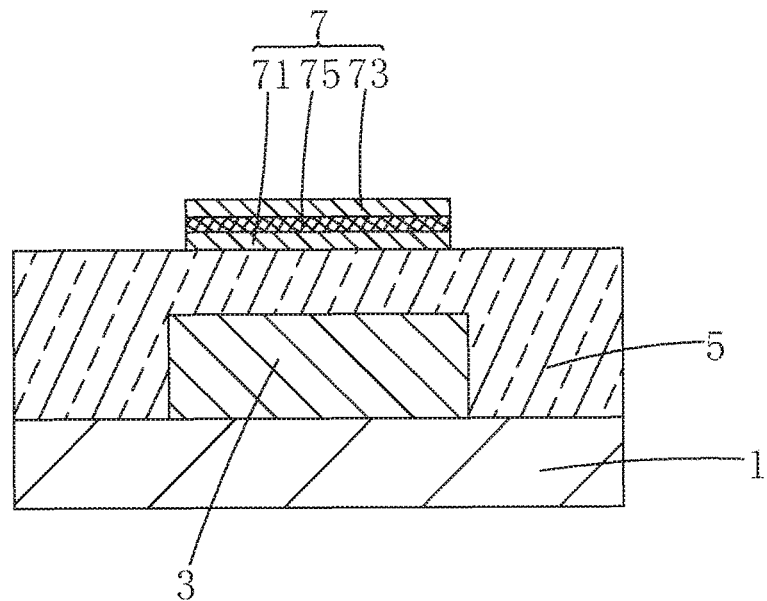
FIG. 6 is a schematic view of the step 4 of the manufacturing method of a metal oxide TFT device according to the present invention.

Step S4, as shown in FIG. 6, a stack-layer of the lower indium gallium zinc oxide thin film 71, the intermediate conducting layer 75, and the upper indium gallium zinc oxide thin film 73 is patterned, to form an active layer 7, similar to a sandwich structure, over the gate electrode 3

Figure 7:
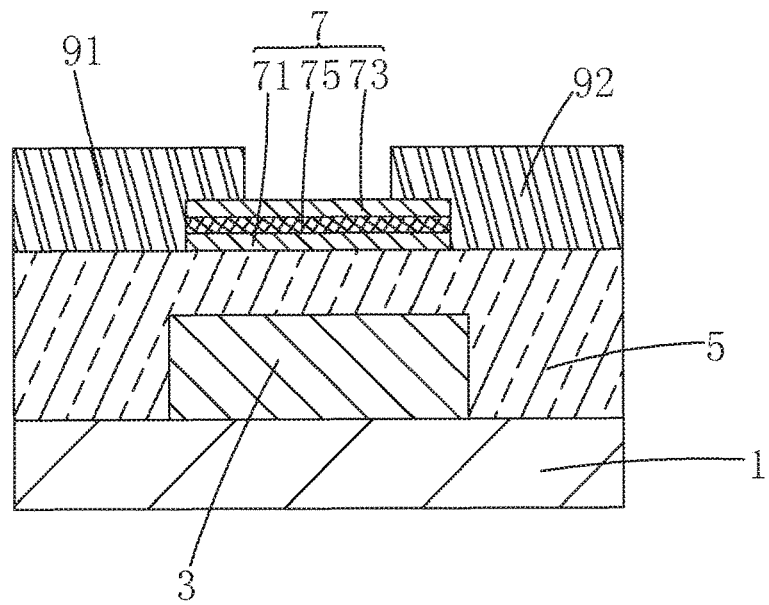
FIG. 7 is a schematic view of the step 5 of the manufacturing method of a metal oxide TFT device according to the present invention.

Step S5, as shown in FIG. 7, a second metal layer is deposed on the gate insulating layer 5 and the active layer 7 by the PVD process and the second metal layer is patterned by the photo process and the etching process to form a source electrode 91 and a drain electrode 92 respectively contacted with two sides of the active layer 7.

A metal oxide TFT device manufactured by the above-described method, the active layer 7 interposes the intermediate conductive layer 75 between the lower indium gallium oxide thin film 71 and the upper indium gallium zinc oxide thin film 73, Zinc oxide is of the material. Since the vacant s orbit of indium In or $Zn^{2+}$ can form an electron transporting path, the intermediate conductive layer 75 has a great amount of $In^{3+}$ or $Zn^{2+}$, thereby further improving the electron mobility of the TFT device and increasing the carrier's concentration. Meanwhile, because a resistance of the intermediate conductive layer 75 is relatively lower than resistances of the lower indium gallium oxide thin film 71 and the upper indium gallium zinc oxide thin film 73, the carriers are mainly concentrated in the intermediate conductive layer 75 which corresponds to the main channel, and the lower indium gallium zinc oxide thin film 71 serves to improve the contact interface between the active layer 7 with the gate insulating layer 5 to reduce interface defects, to prevent the interface defects from affecting the electrical properties of the TFT device and to improve the electrical properties of the TFT device.

As mentioned above, a metal oxide TFT device of the present invention, which applies a structure like sandwich on the active layer, which comprises a lower indium gallium zinc oxide thin film, an upper indium gallium oxide thin film, and an intermediate conducting layer interposed between the lower indium gallium oxide thin film and the upper indium gallium oxide thin film. The intermediate conducting layer is selected from the group consisting of high indium-containing metal oxide and high zinc-containing metal oxide. Since the vacant s orbit of indium ions or zinc ions can form an electron transporting path, and the concentration of carriers can be increased by taking an intermediate conductive layer containing a high indium-containing metal oxide or a high zinc-containing metal oxide as a material, thereby further improving the electron mobility of the TFT device. Meanwhile, because the carriers are mainly concentrated in the intermediate conductive layer which corresponds to the main channel and the lower indium gallium zinc oxide thin film serves to improve the contact interface between the active layer with the gate insulating layer to reduce interface defects, to prevent the interface defects from affecting the electrical properties of the TFT device and to improve the electrical properties of the TFT device. In a metal oxide TFT device manufactured by a manufacturing of a metal oxide TFT device of the present invention, which applies a structure like sandwich on the active layer, which comprises a lower indium gallium zinc oxide thin film, an upper indium gallium oxide thin film, and an intermediate conducting layer interposed between the lower indium gallium oxide thin film and the upper indium gallium oxide thin film, further improving the electron mobility of the TFT device to reduce interface defects between the active layer and the gate insulating layer, to improve the electrical properties of the TFT device.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A metal oxide TFT device, comprising a substrate, a gate electrode provided on the substrate, a gate insulating layer covering the gate electrode and the substrate, an active layer disposed on the gate insulating layer over the gate electrode, and a source electrode and a drain electrode disposed on the gate insulating layer and respectively contacted with two sides of the active layer;

wherein the active layer comprises a lower indium gallium zinc oxide thin film, an upper indium gallium oxide thin film disposed opposite to the lower oxide thin film, and an intermediate conducting layer interposed between the lower indium gallium oxide thin film and the upper indium gallium oxide thin film; the intermediate conducting layer is selected from the group consisting of high indium-containing metal oxide and high zinc-containing metal oxide;

wherein a thickness of the intermediate conducting layer is 2 nm to 10 nm, and a thickness of the active layer is 30 nm to 100 nm; and wherein a block resistance of the intermediate conductive layer is less than or equal to $1 \times 10^4 \Omega/\square$.

2. The metal oxide TFT device according to claim 1, wherein the intermediate conductive layer is selected from the group consisting of indium tin oxide, indium zinc oxide, and aluminum doped zinc oxide.

3. The metal oxide TFT device according to claim 1, wherein
the substrate is a glass substrate;
the gate electrode, the source electrode and the drain electrode are all selected from the group consisting of molybdenum and aluminum, and a stack of molybdenum and aluminum;
the gate insulating layer is selected from the group consisting of silicon oxide or alumina.

4. A manufacturing method of a metal oxide TFT device, comprising:
providing a substrate, deposing a first metal layer, and patterning the first metal layer to form a gate electrode;
deposing a gate insulating layer on the gate electrode and the substrate;
firstly deposing an indium gallium oxide on the gate insulating layer to form a lower indium gallium zinc oxide thin film, secondly deposing a high indium-containing metal oxide or a high zinc-containing metal oxide to form an intermediate conducting layer, then, deposing the indium gallium oxide to form an upper indium gallium zinc oxide thin film;
pattering a stack-layer of the lower indium gallium zinc oxide thin film, the intermediate conducting layer, and the upper indium gallium zinc oxide thin film, to form an active layer over the gate electrode;
deposing a second metal layer on the gate insulating layer and the active layer and patterning the second metal layer to form a source electrode and a drain electrode respectively contacted with two sides of the active layer;
wherein a thickness of the intermediate conducting layer is 2 nm to 10 nm, and a thickness of the active layer is 30 nm to 100 nm; and wherein a block resistance of the intermediate conductive layer is less than or equal to $1 \times 10^4 \Omega/\square$.

5. The manufacturing method of a metal oxide TFT device according to claim 4, wherein the intermediate conducting layer is formed by deposing one from the group consisting of indium tin oxide, indium zinc oxide, and aluminum doped zinc oxide.

6. The manufacturing method of a metal oxide TFT device according to claim 4, wherein
the substrate is a glass substrate;
the first metal layer and the second metal layer are both selected from the group consisting of molybdenum and aluminum, and a stack of molybdenum and aluminum;
the gate insulating layer is selected from the group consisting of silicon oxide or alumina.

7. A metal oxide TFT device, comprising a substrate, a gate electrode provided on the substrate, a gate insulating layer covering the gate electrode and the substrate, an active layer disposed on the gate insulating layer over the gate electrode, and a source electrode and a drain electrode disposed on the gate insulating layer and respectively contacted with two sides of the active layer;
wherein the active layer comprises a lower indium gallium zinc oxide thin film, an upper indium gallium oxide thin film disposed opposite to the lower indium gallium zinc oxide thin film, and an intermediate conducting layer interposed between the lower indium gallium oxide thin film and the upper indium gallium oxide thin film; the intermediate conducting layer is selected from the group consisting of high indium-containing metal oxide and high zinc-containing metal oxide;
wherein the intermediate conductive layer is selected from the group consisting of indium tin oxide, indium zinc oxide, and aluminum doped zinc oxide;
wherein a thickness of the intermediate conducting layer is 2 nm to 10 nm, and a thickness of the active layer is 30 nm to 100 nm; and
wherein a block resistance of the intermediate conductive layer is less than or equal to $1 \times 10^4 \Omega/\square$.

8. The metal oxide TFT device according to claim 7, wherein
the substrate is a glass substrate;
the gate electrode, the source electrode and the drain electrode are all selected from the group consisting of molybdenum and aluminum, and a stack of molybdenum and aluminum;
the gate insulating layer is selected from the group consisting of silicon oxide or alumina.

\* \* \* \* \*